United States Patent
Pen

(10) Patent No.: US 9,276,190 B2
(45) Date of Patent: Mar. 1, 2016

(54) PRACTICAL METHOD OF PRODUCING AN AEROGEL COMPOSITE CONTINUOUS THIN FILM THERMOELECTRIC SEMICONDUCTOR MATERIAL BY MODIFIED MOCVD

(71) Applicant: The Pen, West Hollywood, CA (US)

(72) Inventor: The Pen, West Hollywood, CA (US)

(*) Notice: Subject to any disclaimer, the term of this patent is extended or adjusted under 35 U.S.C. 154(b) by 0 days.

(21) Appl. No.: 14/687,925

(22) Filed: Apr. 16, 2015

(65) Prior Publication Data

US 2015/0325771 A1   Nov. 12, 2015

Related U.S. Application Data

(63) Continuation-in-part of application No. 14/042,729, filed on Oct. 1, 2013, now Pat. No. 9,040,339.

(51) Int. Cl.

| H01L 21/00 | (2006.01) |
|---|---|
| H01L 35/34 | (2006.01) |
| H01L 35/14 | (2006.01) |
| H01L 35/30 | (2006.01) |

(52) U.S. Cl.
CPC ............. *H01L 35/34* (2013.01); *H01L 35/14* (2013.01); *H01L 35/30* (2013.01)

(58) Field of Classification Search
CPC ...................................................... H01L 21/00
USPC .......................................................... 438/54
See application file for complete search history.

(56) References Cited

U.S. PATENT DOCUMENTS

| 6,509,520 B1 | 1/2003 | Kyle et al. |
|---|---|---|
| 6,750,120 B1 | 6/2004 | Kneissl et al. |
| 6,931,203 B2 | 8/2005 | Toda et al. |
| 7,122,844 B2 | 10/2006 | Nakamura et al. |
| 7,141,497 B2 | 11/2006 | Fujiwara et al. |
| 7,461,512 B2 | 12/2008 | Sakamoto et al. |
| 8,110,889 B2 | 2/2012 | Kryliouk |
| 8,133,322 B2 | 3/2012 | Nakamura et al. |
| 8,142,521 B2 | 3/2012 | Wieting et al. |
| 8,231,240 B1 | 7/2012 | Rubio et al. |

(Continued)

FOREIGN PATENT DOCUMENTS

| CA | 2757528 A1 | 10/2010 |
|---|---|---|
| CA | 2757530 A1 | 10/2010 |

(Continued)

OTHER PUBLICATIONS

S. Ganguly, S. L Brock, "Toward Nanostructured Thermoelectrics: Synthesis and Characterization of Lead Telluride Gels and Aerogels," Journal of Materials Chemistry, 2011, 21, 8800-8806.

(Continued)

*Primary Examiner* — Ajay K Arora

(57) ABSTRACT

A method is disclosed of constructing a composite material structure, comprised of an aerogel substrate, which is then overlaid throughout its interior with an even and continuous thin layer film of doped thermoelectric semiconductor such that electrical current is transmitted as a quantum surface phenomena, while the cross-section for thermal conductivity is kept low, with the aerogel itself dissipating that thermal conductivity. In one preferred embodiment this is achieved using a modified metal-organic chemical-vapor deposition (MOCVD) process in the gas phase, with the assist of microwave heating after the reactant gases have evenly diffused throughout the interior of the aerogel substrate.

20 Claims, 1 Drawing Sheet

(56) References Cited

U.S. PATENT DOCUMENTS

| | | | |
|---|---|---|---|
| 8,512,798 B2 | 8/2013 | Selvamanickam et al. | |
| 8,841,221 B2 | 9/2014 | Brien et al. | |
| 2005/0150535 A1* | 7/2005 | Samavedam | H01L 23/38 136/201 |
| 2005/0150536 A1 | 7/2005 | Ngai | |
| 2005/0150539 A1 | 7/2005 | Ghoshal et al. | |
| 2005/0247337 A1 | 11/2005 | Chen et al. | |
| 2006/0076046 A1 | 4/2006 | Ghoshal et al. | |
| 2006/0088271 A1 | 4/2006 | Ghoshal | |
| 2006/0157101 A1 | 7/2006 | Sakamoto et al. | |
| 2008/0022695 A1 | 1/2008 | Welle et al. | |
| 2008/0022696 A1 | 1/2008 | Welle et al. | |
| 2009/0205696 A1 | 8/2009 | Koester et al. | |
| 2010/0024437 A1 | 2/2010 | Elsner et al. | |
| 2010/0229911 A1 | 9/2010 | Leavitt et al. | |
| 2011/0083711 A1 | 4/2011 | Plissonnier et al. | |
| 2011/0083713 A1 | 4/2011 | Narducci | |
| 2011/0139207 A1 | 6/2011 | Edwards | |
| 2011/0260800 A1 | 10/2011 | Shanfield et al. | |
| 2012/0024332 A1 | 2/2012 | Stefan et al. | |
| 2012/0103381 A1 | 5/2012 | Leavitt et al. | |
| 2012/0192574 A1 | 8/2012 | Ghoshal et al. | |
| 2012/0301360 A1 | 11/2012 | Meinhold et al. | |

FOREIGN PATENT DOCUMENTS

| | | |
|---|---|---|
| CA | 2802346 A1 | 12/2011 |
| CN | 100413392 C | 8/2008 |
| CN | 1909955 B | 11/2010 |
| DE | 19527465 C2 | 9/1998 |
| EP | 0912329 A1 | 5/1999 |
| EP | 1926155 B1 | 10/2010 |
| EP | 2277209 A2 | 1/2011 |
| EP | 2315987 A2 | 5/2011 |
| EP | 2330181 A1 | 6/2011 |
| EP | 2436043 A2 | 4/2012 |
| EP | 2454549 A1 | 5/2012 |
| EP | 2457270 A | 5/2012 |
| EP | 2508044 A1 | 10/2012 |
| EP | 2583014 A2 | 4/2013 |
| EP | 2630669 A2 | 8/2013 |
| WO | 2005071765 B1 | 9/2005 |
| WO | 2006047235 A2 | 5/2006 |
| WO | 2008057914 A2 | 5/2008 |
| WO | 2008130431 A | 10/2008 |
| WO | 2009151251 A2 | 12/2009 |
| WO | 2010065121 A1 | 6/2010 |
| WO | 2010085767 A1 | 7/2010 |
| WO | 2010085769 A1 | 7/2010 |
| WO | 2010147638 A2 | 12/2010 |
| WO | 2011007241 A1 | 1/2011 |
| WO | 2011009935 A | 1/2011 |
| WO | 2011012549 A1 | 2/2011 |
| WO | 2013050961 A1 | 4/2013 |
| WO | 2013119287 A1 | 8/2013 |
| WO | 2013119293 A2 | 8/2013 |

OTHER PUBLICATIONS

S. Ganguly, C. Zhou, D. Morelli, J. Sakamoto, S. L. Brock, "Synthesis and Characterization of Telluride Aerogels: Effect of Gelation on Thermoelectric Performance of $Bi_2Te_3$ and $Bi_{2-x}Sb_xTe_3$ Nanostructures," Journal of Physical Chemistry C, 2012, 116 (33), 17431-17439.

J. Xie, A. Frachioni, D. S. Williams, B. E. White, Jr. "Thermal conductivity of a ZnO nanowire/silica aerogel nanocomposite," Applied Physics Letters, 2013, 102, 193101.

H. Tong, J. Zhang, G. Liu, J.A. Herbsommer, G. S. Huang, N. Tansuc "Thermoelectric properties of lattice-matched AlInN alloy grown by metal organic chemical vapor deposition," Applied Physics Letters, 2010, 97, 112105.

D. Shenai, M. L. Timmons, R. L. Dicarlo, G. K. Lemnah, R. S. Stennick "Correlation of vapor pressure equation and film properties with trimethylindium purity for the MOVPE grown III-V compounds," Journal of Crystal Growth, 2003, 248, 91.

N. Lu, I. Ferguson "III-nitrides for energy production: photovoltaic and thermoelectric applications," Semiconductor Science and Technology, 2013, 28, 074023.

W. Shin, M. Ishikawa, M. Nishibori, N. Izu, T. Itoh, I. Matsubara "High-Temperature Thermoelectric Measurement of B-Doped SiGe and Si Thin Films," Materials Transactions, 2009, 50, 7, 1596.

* cited by examiner

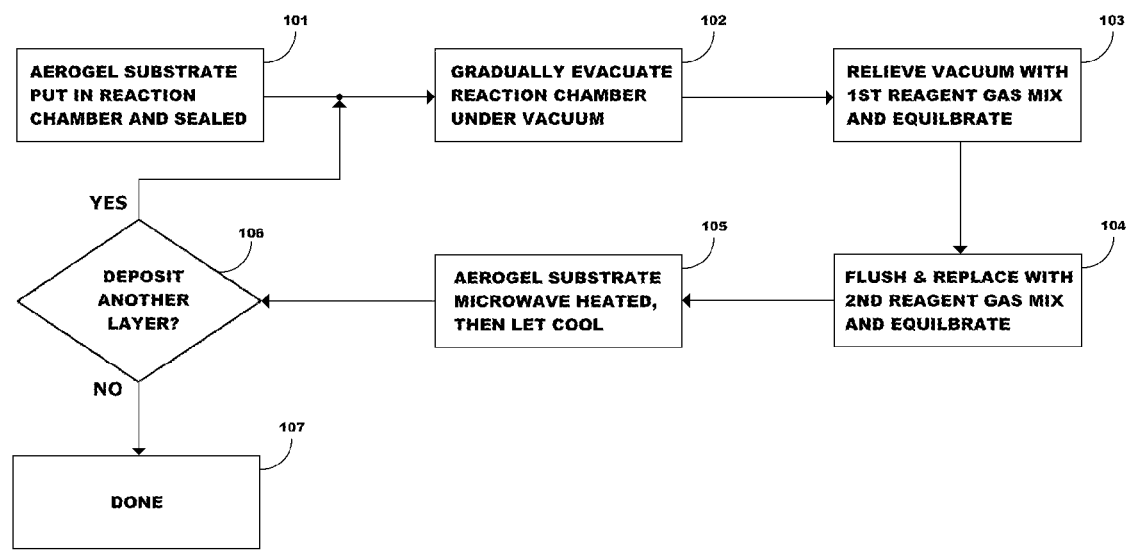

PRACTICAL METHOD OF PRODUCING AN AEROGEL COMPOSITE CONTINUOUS THIN FILM THERMOELECTRIC SEMICONDUCTOR MATERIAL BY MODIFIED MOCVD

CROSS-REFERENCE TO RELATED APPLICATIONS

This application is a Continuation-In-Part of and claims priority from U.S. patent application Ser. No. 14/042,729, PRACTICAL METHOD OF PRODUCING AN AEROGEL COMPOSITE CONTINUOUS THIN FILM THERMOELECTRIC SEMICONDUCTOR MATERIAL, filed Oct. 1, 2013, and allowed on Jan. 21, 2015 (the "parent application"). Any disclosures in the parent application not repeated verbatim in this filing are expressly incorporated as if reproduced in their entirely herein.

COPYRIGHT NOTICE

A portion of the disclosure of this patent document contains material which is subject to copyright protection. The copyright owner has no objection to the facsimile reproduction by anyone of the patent document or the patent disclosure as it appears in the Patent and Trademark Office Patent file or records, but otherwise reserves all copyrights whatsoever.

BACKGROUND

With the looming threat of global warming climate change driven by exponentially increasing levels of carbon dioxide in the atmosphere, there is an urgent need to develop new carbon neutral energy production technologies. Even the best of current photovoltaic solar cell technologies in development capture less than half of the available solar energy. Indeed, one of the issues is how to dissipate the "waste" heat in such systems. Thermoelectric modules convert heat to electricity, but demonstrated efficiencies have lagged behind the photovoltaics. If efficiencies could be boosted they would become more attractive for backing up existing photovoltaics as a second power generation stage, or for use standing alone.

Thermoelectric efficiency (called the figure of merit) is proportional to electric conductivity and inversely proportional to thermal conductivity. These two conductivities tend to be related, so the challenge has been to formulate or construct materials where the first is boosted while the second is reduced. Aerogel materials are known for their exceptionally low heat conductivity, and it was hoped that aerogels derived from the best performing thermoelectric bulk materials as a single formula component would offer much better performance, but results by other methods have not yet met those high expectations.

OBJECTIVES OF THIS INVENTION

This application teaches how to construct a composite material structure, comprised of an aerogel, in one embodiment silica based, which is then overlaid throughout its interior with an even and continuous thin layer film of doped thermoelectric semiconductor. In this way electrical current is transmitted as a quantum surface phenomena, while the cross-section for thermal conductivity is kept low, with the aerogel itself dissipating that thermal conductivity.

For much the same reason that aerogels are such superb heat insulators, gases normally diffuse slowly in and out of aerogels, making conventional thin film deposition processes unavailing to achieve an even and continuous thin film distribution. The parent application taught a materially modified successive ionic layer adsorption and reaction ("SILAR") process on a wet aerogel precursor, by which route many useful chalcogenide films and some compounds with Group 15 anions can be attained. To achieve like structures with other Group 15 elemental components like nitrides, phosphides, arsenides, etc., and also Group 14 compounds like carbides and silicides, germanides, etc., (hereinafter collectively the "less metallic elemental components"), where a thin film compound layer is formed with one or more of the group of metals in Groups 2-12, together with the post-transition metals and metalloids in Groups 13-14 (hereinafter collectively the "more metallic elemental components") the parent application further taught the following method at paragraph [0031]:

"This applicant proposes to use gentle induction or microwave heating to maintain the internal temperature of the aerogel at a moderately higher temperature than the incoming gases. Fine control could be achieved by combining infrared temperature sensing with a microprocessor control circuit. This might make other materials accessible like thin films of nitrides, carbides and silicides, which also have thermoelectric potential."

Accordingly, this application will now proceed with additional disclosures consistent with that proposal, describing in more particular detail a materially modified metal-organic chemical-vapor deposition (MOCVD) process, whereby reactant gases are allowed to gradually diffuse into the aerogel and equilibrate, and then their reaction is activated evenly throughout interior of the aerogel by microwave or inductive heating, where if mixed directly at the reaction temperature the reactant gases would deposit on the first exterior surface they encounter.

BRIEF DESCRIPTION OF THE DRAWING

FIG. 1 is a flow diagram illustrating the reaction and processing steps executed in the application of a specific embodiment of the present invention

PRIOR ART

Others have proposed different constructions which are easily distinguishable, for example coating semiconductor nanowires with aerogel [*Appl. Phys. Lett.* (2013) 102:193101, EP 2277209 A2. CA 2757528 A1, US 20110083713 A1]. filling the spaces between or around fabricated thermoelectric elements with insulating aerogel filler [EP 2454549 A1, CA 2757530 A1, WO 2005071765 B1, WO 2013119293 A2, EP 2630669 A2, WO 2013119287 A1, EP 2457270 A1, WO 2013050961 A1, WO 2011009935 A1, EP 1926155 B1, EP 2436043 A2, WO 2011012549 A1, U.S. Pat. No. 6,509,520 B1, EP 2315987 A2, WO 2006047235 A2, US 20060157101 A1, US 20120024332 A1, EP 2583014 A2, US 20080022696 A1, EP 2508044 A1, US 20080022695 A1, US 20100024437 A1, US 20110260800 A1, US 20110083711 A1, US 20100229911 A1, US 20120103381 A1, WO 2008057914 A2, WO 2010085769 A1, WO 2010085767 A1, EP 2330181 A1, DE 19527465 C2, US 20090205696 A1, US 20060076046 A1, US 20110083713 A1, EP 0912329 A1, US 20120192574 A1, US 20050247337 A1, U.S. Pat. No. 8,231, 240 B1, CA 2802346 A1, US 20060088271 A1], using aerogels as insulating films, [WO 2011007241 A1, U.S. Pat. No. 7,461,512 B2, CN 100413392 C, WO 2009151251 A2, US 20050150535 A1, US 20050150539 A1, US 20050150536 A1], constructing an aerogel from a thermoelectric material alone [*J. Phys. Chem. C*, (2012) 116:33:17431-17439, *J. Mater. Chem.* (2011) 21:8800-8806, WO 2010065121 A1], or dispersing thermoelectric nanoparticles or other elements in an aerogel matrix (for non-power generation purposes) [US 20120301360 A1, WO 2010147638 A2, WO 2008130431 A2, CN 1909955 B].

With specific reference to other proposals for MOCVD procedures, the conventional method is to establish a gas flow over a substrate material after it is already at a highly elevated temperature, in the hope of maximizing reaction at the exposed exterior surface before the gases rush by. [U.S. Pat. No. 6,750,120 B1, U.S. Pat. No. 8,512,798 B2, U.S. Pat. No. 6,931,203 B2, U.S. Pat. No. 7,141,497 B2, U.S. Pat. No. 7,122,844 B2, U.S. Pat. No. 8,110,889 B2, U.S. Pat. No. 8,133,322 B2, U.S. Pat. No. 8,142,521 B2, U.S. Pat. No. 8,841,221 B2] By contrast, by the method of this invention the reactant gases do not react with each other until after they have fully diffused throughout the interior of the aerogel substrate. This is the opposite strategy from preheating the substrate before introducing the reactant gasses, where by the method of this invention, if heat is applied at all, it is done so only after the reactant gasses have fully diffused throughout the substrate in place.

U.S. patent application Ser. No. 12/993,567 ("Edwards"), same as foreign applications WO 2009140730 A1 and EP 2297795 A1, purports to describe a "thermoelectric element comprising a porous substrate," which substrate might be an aerogel, "coated with one or more materials, at least one of which is a thermoelectric material." [Edwards Claims 1, 20] (Other references in brackets below are to paragraphs, examples and claims in the Edwards application.)

However, Edwards offers no actual practical method for achieving, with an aerogel in particular, the even and continuous thin film layer throughout its interior as described in this application. Edwards concedes that his preferred technique, atomic layer deposition ("ALD"), defined by him as being done in the gas phase, is greatly problematic when applied to so-called porous materials of any thickness. [0070], [0073] This is especially so in the case of an aerogel which despite its many pores is relatively impermeable to free gas "flow-through."

So while suggesting a chemical vapor deposition possibility in the general sense [0059], Edwards failed to disclose a practical solution to the actual problem, and offered no practical route to the end product described herein, requiring the novel and material modifications disclosed by this application, designed specifically to achieve these new aerogel composite materials. For all these reasons, Edwards' evocation that, "The thermoelectric material may be deposited on the substrate using any technique known to be suitable to a person skilled in the art," is not availing to overcome the claims of this applicant.

To try to overcome the limitations of his own method, Edwards chose to work with the thinnest possible aerogels, no more than 250 micrometers in thickness (about 3 sheets of paper), and even to do that it was required to reinforce the aerogel with fiberglass fibers. [Example 12] This of course greatly defeats the primary theoretical purpose of an aerogel in such a construction, by increasing its naturally minimal thermal conductivity, the very quality which would recommend its use. And Edwards further concedes that making devices thinner than 1-2 mm in thickness incurs higher heat flow (destructive of thermoelectric efficiency), [0011] and offers no claim even that his thin aerogel materials achieve "uniform" coating. Edwards only offers that he "surprisingly found" that they had any thermoelectric properties at all, [0073] apparently not even as good as those achieved by him, with cellulose substrates under identical conditions, [comparing Examples 4, 13] proving that he was able to gain no utilitarian advantage from the use of aerogel.

In short, Edwards' use of the words "coated" on its "surface", [Claim 1] even modified by the word "completely", [Claim 2] is insufficiently specific to describe the product material claimed by this application. with the thermoelectric material distributed in an aerogel by a thin layer film evenly throughout its interior, and none of Edwards' "method" claims, nor does his specification, include any procedural details which might actually enable its practical production.

As contrasted by the following:

SAMPLE EXPERIMENTAL PROCEDURE

A stainless steel reaction chamber is provided with valved input and output ports for reactant and carrier gases, a holder for an aerogel substrate, an infrared temperature sensing device to measure the temperature of the aerogel substrate, a microwave source under microprocessor control, a chamber pressure sensing device, and pumps to evacuate the chamber and/or purge it with replacement gases. A freshly prepared and fully supercritically dried silica aerogel substrate is placed in the chamber at 25° C., which is then sealed, FIG. 1, 101, and gradually evacuated over a period of one hour, 102. Hydrogen gas is bubbled separately through trimethylaluminum (TMA), to saturate the hydrogen gas with reagent vapors, and using a UNI-FLO device [*Journal of Crystal Growth*, 2003, 248, 91] through trimethyindium (TMI), a solid at room temperature, and silane is also used as a reagent. The reagent and vapor laden gases are then combined in molar proportion by their metal constituents in the ratio of 0.83/0.17/0.0001 as to Al/In/Si, adding additional hydrogen gas to the mixture as necessary to achieve this, and the vacuum in the chamber is gradually released back to one atmosphere by introduction of the reagent gas mixture through an input port, 103. Once the reactant gasses have diffused evenly throughout the interior of the aerogel substrate, the chamber is quickly flushed with pure hydrogen gas to purge the remaining reagent gas mixture. The hydrogen gas is then itself purged with a mixture of hydrogen gas and ammonia, which is allowed to diffuse and equilibrate throughout the interior of the aerogel substrate over a period of 6 hours, 104. The microwave source is then used to heat the aerogel to a temperature of 600° C., as measured by the infrared temperature sensing device, 105. During this heating process the pressure in the chamber can be increased to equilibrate the gas pressure internal and external to the aerogel substrate. The aerogel substrate is maintained at a temperature of 600° C. for one hour, and then the substrate is allowed to cool gradually, while chamber pressure is relaxed again in turn to the initial pressure conditions. The process cycle can be repeated to add additional layer thickness as desired, 106.

DESCRIPTION

A number of observations about the various novel aspects of the example procedure above are in order. In this embodiment all the metallic reactants are greatly pyrophoric, so reactive that they will immediately begin to react even at room temperature with the ammonia introduced subsequently. Because of their high reactivity, as they diffuse throughout the interior of the aerogel they naturally coordinate as adducts with the remaining exposed hydroxyl groups within the aerogel substrate, which tend to keep them in place while awaiting the introduction of the ammonia gas phase. Having already noted their reactivity with the ammonia, the purpose of the heating step is primarily to ensure that the reaction goes to completion in depositing the thin film. In the case of subsequent additional layers, exposed amine groups from the previous layer provide a new set of coordination sites.

While aerogels are remarkably impermeable to heat transfer and free gas flow, they are much more transparent to electromagnetic radiation, though more adsorbent than free gas. In the visible spectrum silica aerogel has the appearance of faint light blue smoke, as if there is almost nothing there. Accordingly, microwave heating in particular is a means to quickly and evenly raise the temperature of an aerogel throughout its interior.

A temperature of 600° C. is about the limit beyond which a silica aerogel substrate will start to deform, though it will not fully melt until it reaches 1,200° C. An alumina aerogel has similar properties if that were to be used as a substrate. But any other aerogel could be used, including those formed from oxides of any metallic atom selected from the group of the metals on the periodic table in groups 2-12 together with the poor metals on the periodic table in groups 13-15, or any combination of them, according to techniques known by those skilled in the art.

Aerogels have great strength under compression, but are more friable under conditions of sudden applied vacuum. For this reason the evacuation step must be done gradually to protect the structure. But the vacuum can be relieved at a greater pace, where the vacuum greatly assists pulling the initial reactant gases into the interior of the aerogel substrate. This is also why we might want to pressure compensate during the heating phase, which also has the side benefit of tending to keep the reactant gases confined to the interior of the aerogel substrate. Alternatively, in other embodiments the evacuation phase might be dispensed with, and the reactant gas phase might be allowed to itself simply diffuse into the aerogel on its own time. But given the vigorous reactivity of the these reagents with water, including possible residual water vapor (or even carbon dioxide which also reacts with TMA) in the interior of the aerogel depending on how it was handled, the evacuation step would be considered a preferred embodiment for this reason alone.

TMA has a vapor pressure of about 10 torr at room temperature, while the vapor pressure of TMI is about 2 torr, so the natural partial pressures of these vapors is close to the proportion specified in the example procedure. All this presumes a chamber pressure of 1 atm just prior to the heating phase. But higher vapor concentrations can be achieved under reduced pressure conditions, optimally for this purpose in the 100-200 torr range, though MOVCD has been successfully performed down to the 5-10 torr range. The effect of pulling the reactive reagents into the aerogel interior by vacuum release is most effective at the higher end of the reaction pressure range, so this is a tradeoff between speed of diffusion and effective concentrations. In other embodiments, the reaction may be commenced at greater pressure than normal atmosphere, and the gases can be introduced at higher temperatures, as long as they are starting below their reaction threshold.

As an alternative procedure using these same elemental components, the nitrogen source could be hydrazine, any of various volatile primary, secondary or tertiary amines, or even a simple mixture of hydrogen and nitrogen gasses, which will generate an ammonia equivalent under the reaction conditions. This happens in the example procedure not only because of the elevated temperature, but because the microwave exposure prompts this reaction, as is known in the art. In the case of the use of a mixture of hydrogen and nitrogen gas, or any other amine suitably less reactive than ammonia, this can even be included in the initial reactant gas mix, where the final deposition will not proceed until the heating phase. Also in this case, thicker layers may be deposited in one step, without relying on just the reactants that will physically coordinate, because once fully diffused, on heating the reaction will take place faster than the reactants can then displace.

The carrier gas in the example procedure was chosen to be hydrogen, but helium or any other suitably inert gas might be employed, including nitrogen where under the reaction conditions in this case it can also serve as a reagent as just demonstrated.

Conversely, depending on the reactivity of the components under room temperature conditions, the heating step may not be required at all in another embodiment, as long at the reaction has time to proceed to completion, as in the parent application. In any case, the key novelty is the method of achieving even gas reactant distribution, in this embodiment achieved both by patience of time and vacuum assist. That is, the reactants are allowed to equilibrate throughout the substrate under conditions where the final deposition reaction will not take place, either by introducing the more metal elemental component first and allowing it to form coordinated adducts with the substrate, and/or by using induced heat to rapidly drive the reaction to completion after and while the components are trapped in place, in which case slow gas diffusion is now the friend of our process.

In the simplest case, simply alternating exposures of the more metallic elemental component and the less metallic elemental component with sufficiently long equilibration times may suffice, as was demonstrated for liquid solutions in the parent application. In another embodiment it is possible to combine the more and the less metallic elemental components into a single precursor, for example $Ga(C_2H_5)NH_3$ or $Ga(CH_3)_3N(CH_3)_3$, which after fully diffused will decompose and deposit upon microwave heating.

As already suggested, the heating can also be done by an inductive heating element in another embodiment, though care must be taken to avoid runaway melting, as receptivity to the heating effect by this method increases with temperature, with greater effects on conductive metals as well, including the interior of the reaction chamber itself. And in all embodiments where heating energy is applied, a further embodiment would be to rotate the aerogel substrate relative to the heating element during the heating cycle to ensure even heating. Unlike a furnace type MOCVD setup, the heat is applied specifically to the substrate itself by microwave exposure, with the rest of the chamber lagging at a lower temperature. During the cooling phase, cooler gas can be circulated through the chamber to assist in this. In another embodiment, the chamber can be again evacuated, and then the vacuum can be relieved with cooler gas to aid in the cooling, given the inherent resistance of the aerogel substrate to direct heat transfer.

In the case of multiple process cycles, different gas reactant mixes can be used to lay down either base or capping layers. In addition, multiple deposition cycles can be used to more stringently control the relative composition of the thin film layer throughout the interior of the aerogel substrate. For example, one might alternate cycles with just one of a number of the more metallic elemental components. This would also tend to defeat the possibility of one of the reactant vapors being depleted relative to the other during the process of diffusion into the interior of the aerogel substrate, in the case of differential reactivity to form adducts with the substrate. In another embodiment, the less metallic elemental component might also be different from layer to layer.

The reagents in the example embodiment were chosen because various nitrides of Group 14 metals have already demonstrated thermoelectric potential using various combinations of aluminum, gallium and indium. [*Applied Physics Letters*, 2010, 97, 112105] Besides the trimethyl reagents, alternatives are various combinations of these metals with ligands of hydrogen, halide and small alkyl groups, including all the sesquichlorides, which would include $MH_2Cl$, $MHCl_2$, $MRCl_2$, $MR_2Cl$, etc., where M is the more metallic elemental component and R is an alkyl group, methyl, ethyl, etc. As already suggested various amido ligands can also be used. In the case of gallium, the trihydride has also been used in other MOCVD procedures.

In the sample experimental procedure silane was used as an n-type dopant, with a prevalence of 100 ppm. Other possible dopants in this context include germanium (for example germane), iron (for example ferrocene), magnesium (for example $Cp_2Mg$), zinc (for example diethylzinc), etc. Though any of the more metallic elemental components suitable for primary material in one compounding may be suitable as a dopant in another. The goal of a thin film with its own minimized thermal conductivity, and correspondingly better figure of merit, is achieved by the disorder resulting from a mix of materials.

Of very particular interest also is silicon germanide, often referred to as silicon-germanium, as the thin film, in which case gases of silane and germane can simply be alternated, cut with hydrogen as carrier gas as desired. Some sources have suggested a reduced proportion of 0.2/0.8 of germanium as to silicon in the thin film, with boron doping. [*Materials Transactions*, 2009, 50, 7, 1596] This can easily be achieved by the method of this invention with concentration control, since raising the temperature of silane over 420° C. causes it to decompose and deposit silicon, while producing hydrogen. Likewise, germane decomposes in the same way at a relatively mild 325° C. And in this case the dopant can be derived from borane.

Indeed, the method of this invention can be extended to any of the other Group 14 or 15 elements to produce carbides, silicides, phosphides, arsenides, etc, as the less metallic elemental component, as already defined, with appropriate choice of reagents. The more metallic elemental components can be a mix of any of the Group 2-12 metals, together with any of the Group 13-14 post-transition and metalloid elements as already demonstrated and defined. For the purposes of the method of this invention we will include compounds within the same metal group, silicon germanide in particular, where one element in the compound is more electropositive, that is, metallic, than the other. Compounds featuring boron, titanium, cobalt, chromium and numerous others as the more metallic elemental component have been the subject of recent experiments for their thermoelectric potential, which may be maximized by the structures achieved by the method of this invention. Where the compounds with chlorine alone are volatile enough for MOCVD, they can also be used.

The best conventionally known thermoelectric material, based on bismuth telluride, is not suitable for extreme high temperature operation, which would be desirable in various heat energy recovery applications. Other compounds and structures available by the methods of the parent application are more heat resistant, but the nitrides described herein are especially well suited to high temperature applications, with the advantage of greater Carnot efficiencies, all other things being equal. Moreover, in its nitride (or other Group 14 or 15 compound) coated state the aerogel composite structures described herein can withstand higher temperatures than the starting aerogel substrate alone and still retain their integrity.

So while the instant application may include specific compounding suggestions, the key to the fundamental novelty of this invention is not the particular selection of reagent components, but rather the construction of a continuous thin film layer of thermoelectric semiconductor material overlaid on an aerogel foundation evenly throughout its interior, and at least one more particular practical method for achieving that structure.

The thickness of the thermoelectric layer may range from an atom or two thick, approaching a monolayer of about 0.2 nm, to about 10 nm, with a median of about 1-2 nm based on a presumed pore size distribution in the gel in the 8 nm range, but can vary proportionally to pore size based on the parameters of the gel preparation.

Lastly, it has not escaped the imagination of this applicant that the methods disclosed herein have potential applications beyond the production of innovative thermoelectric materials. Using these techniques, a new family of super-strong super-light composite materials may be obtained by applying the nitrides, carbides, borides, etc. of hafnium, zirconium, titanium, and tantalum in particular, and combinations of all these, to porous substrates, including, but not limited to, aerogels. Boron nitride, one of the hardest single compound materials known is also of interest for this purpose.

Those skilled in the art will appreciate that the present invention may be susceptible to variations and modifications other than those specifically described. It will be understood that the present invention encompasses all such variations and modifications that fall within its spirit and scope.

I respectfully claim:

1. A method of producing an aerogel composite continuous thin film layer thermoelectric semiconductor material by modified MOCVD, comprising:
   a) An aerogel substrate sealed in a reaction chamber,
   b) Introducing into the reaction chamber a first reactant gas mixture, comprising a carrier gas, and a gas or vapor containing at least one of the more metallic elemental components, selected from the group of the metals in Groups 2-12, grouped together with the post-transition metals and metalloids in Groups 13-14,
   c) Allowing the first reactant gas mixture to diffuse and equilibrate evenly throughout the interior of the aerogel substrate, coordinating with the interior surfaces of the said aerogel substrate,
   d) Optionally including in the first reactant gas mixture a gas or vapor containing at least one of the less metallic elemental components, selected from the elements in Groups 14 and 15, where doing so will not result, without temperature elevation, in the deposit in the interior of the aerogel substrate of a thin film of a compound of the least one of the more metallic elemental components and the least one of the less metallic elemental components,
   e) Optionally, or alternatively to step 1(*b*), introducing a second reactant gas mixture, comprising a carrier gas, and a gas or vapor containing at least one of the less metallic elemental components, and allowing the second reactant gas mixture it to diffuse and equilibrate evenly throughout the interior of the aerogel substrate,
   f) Raising the temperature of the aerogel substrate with a source of heat energy, so as to drive to completion a reaction to deposit in the interior of the aerogel substrate of a thin film of a compound of the at least one of the more metallic elemental components and the at least one of the less metallic elemental components, faster than the at least one of the more metallic elemental components or the at least one of the less metallic elemental components can displace within the aerogel substrate, g) Allowing the aerogel substrate to cool, assisted optionally by the circulation of cooler carrier gas through the reaction chamber, h) Optionally repeating steps 1(b) through 1(g) above, to deposit additional layers of a thin film of a compound of the at least one of the more metallic elemental components and the at least one of the less metallic elemental components.

2. The method of claim 1 where raising the temperature in step 1(f) is performed by microwave heating as the source of heat energy.

3. The method of claim 1 where raising the temperature in step 1(f) is performed by inductive electric heating as the source of heat energy.

4. The method of claim 1, where in stop step 1(f), the aerogel substrate is rotated in relation to the source of heat energy.

5. The method of claim 1, where in the process of raising the temperature in step 1(f), the temperature of the aerogel substrate is monitored by an infrared sensing device, and the gas pressure in the reaction chamber is increased to equal the estimated gas pressure in the interior of the aerogel substrate according to temperature.

6. The method of claim 1 where in step 1(b) and 1(c), the diffusion of the first reactant gas mixture is assisted by first gradually evacuating the reaction chamber under vacuum, and then relieving the vacuum by the introduction of the first reactant gas mixture.

7. The method of claim 1, where in step 1(d) the at least one of the more metallic elemental components and the at least one of the less metallic components are combined in a precursor compound.

8. The method of claim 1, where in step 1(d) the at least one of the less metallic elemental component is part of the carrier gas in step 1(b).

9. The method of claim 1, where in step 1(b), the first reactant gas mixture contains a mixture of more than one of the more metallic elemental components.

10. The method of claim 1, where in step 1(d) the first reactant gas mixture contains a mixture of more than one of the less metallic elemental components.

11. The method of claim 1, where in step 1(e) the second reactant gas mixture contains a mixture of more than one of the less metallic elemental components.

12. The method of claim 1, where the cooling in step 1(g) is assisted by gradually evacuating the reaction chamber under vacuum, and relieving the vacuum with cooler carrier gas.

13. The method of claim 1, where before step 1(e), the reaction chamber is flushed with carrier gas.

14. The method of claim 1, where before step 1(f), the reaction chamber is flushed with carrier gas.

15. The method of claim 1, where in step 1(h) a different combination of the at least one of the more metallic elemental components and/or the at least one of the less metallic elemental components are used than in the previous series of steps 1(b) through 1(g), to deposit an additional thin film layer.

16. The method of claim 15, where the thin film layer is either a base layer or a capping layer.

17. The method of claim 1, where the carrier gasses in steps 1(b) and 1(e) are comprised of at least one from the group of hydrogen, nitrogen, helium, and the group of other noble gasses.

18. The method of claim 1, where a dopant is added to either the first reactant gas mixture in step 1(b) or the second reactant gas mixture in step 1(e).

19. The method of claim 1, where the aerogel substrate is formed from oxides of any metallic atom selected from the group of the metals on the periodic table in groups 2-11 together with the poor metals on the periodic table in groups 12-15, or any combination of them.

20. An aerogel composite continuous thin film layer thermoelectric semiconductor material produced in accordance with the method of claim 1.

* * * * *